United States Patent
Chee et al.

(10) Patent No.: US 7,413,011 B1
(45) Date of Patent: Aug. 19, 2008

(54) OPTICAL FIBER SYSTEM AND METHOD FOR WELLHOLE SENSING OF MAGNETIC PERMEABILITY USING DIFFRACTION EFFECT OF FARADAY ROTATOR

(75) Inventors: Soon Seong Chee, Kokubunji (JP); Remy Parmentier, Boulogne-Billancourt (FR); Xu Wu, Paris (FR); Colin Wilson, Kawasaki (JP); Juei Igarashi, Yokohama (JP)

(73) Assignee: Schlumberger Technology Corporation, Sugar Land, TX (US)

( * ) Notice: Subject to any disclaimer, the term of this patent is extended or adjusted under 35 U.S.C. 154(b) by 0 days.

(21) Appl. No.: 11/964,055

(22) Filed: Dec. 26, 2007

(51) Int. Cl.
*E21B 47/00* (2006.01)

(52) U.S. Cl. .................. 166/250.01; 166/66.5; 324/220; 324/221

(58) Field of Classification Search ........................ None
See application file for complete search history.

(56) References Cited

U.S. PATENT DOCUMENTS

| | | | | |
|---|---|---|---|---|
| 5,117,182 | A * | 5/1992 | Cecco et al. ................. | 324/220 |
| 7,077,200 | B1 * | 7/2006 | Adnan et al. ............ | 166/250.01 |
| 2003/0117134 | A1 * | 6/2003 | Almaguer .................... | 324/221 |

OTHER PUBLICATIONS

G.B. Scott and D.E. Lacklison, "Magnetooptic Properties and Applications of Bismuth Substituted Iron Garnets," IEEE Transactions on Magnetics, vol. Mag. 12, No. 4, Jul. 1976.
T.R. Johansen et al, "Variation of Stripe Domain Spacing in a Faraday Effect Light Deflector," Journal of Applied Physics, vol. 42, No. 4, Mar. 15, 1971.
V. J. Fratello, "Sensitivity of Faraday Rotator for Sensor Applications", Integrated Photonics Inc., Feb. 2004.
V. J. Fratello, "Preliminary Applications Note—Thick Film Faraday Rotator for Polarization Control Applications", Integrated Photonics Inc., Oct. 1, 2003.
G. D. VanWiggeren and R. Roy, "Transmission of Linearly Polarized Light through a single mode fiber with random fluctuations of bireferegence", Appl. Optics, vol. 38 No. 18, 1999.
U Holm, H Sohlström and T Brogårdh, "Measurement system for magneto-optic sensor materials", J. Phys. E: Sci. Instrum., vol. 17, p. 885-889, 1984.
L. Veeser, P. Rodriguez, P. Forman, M. Deeter, "Optical Wheel-Rotation Sensor", Optical Fiber Sensor Conference, 1994.
H. Sohlström, "Fibre Optic Magnetic Field Sensors Utilizing Iron Garnet Materials", Thesis Paper, Instrumentation Laboratory, Sweden, 1993.
M.N. Deeter, A. H. Rose and G. W. Day, "Fast, Sensitive Magnetic-Field Sensors Based on the Faraday Effect in YIG", J. Lightwave Tech., vol. 8, No. 12, pp. 1838-1842, 1990.
H. Takeuchi, S. Ito, I. Mikami and S. Taniguchi, "Faraday Rotation and Optical Absorption of a Single Crystal of Bismuth-substituted Gadolinium Iron Garnet", J. Appl. Phys., vol. 44, p. 4789, 1973.

* cited by examiner

*Primary Examiner*—Zakiya W. Bates
(74) *Attorney, Agent, or Firm*—Matthias Abrell; Jaime Castano; Dale Gaudier

(57) ABSTRACT

Systems and methods for optically determining casing collar and/or corrosion locations within boreholes, using the diffraction effect of Faraday crystals through which depolarized continuous light is transmitted within optical fibers.

11 Claims, 8 Drawing Sheets

OPTICAL FIBER SYSTEM AND METHOD FOR WELLHOLE SENSING OF MAGNETIC PERMEABILITY USING DIFFRACTION EFFECT OF FARADAY ROTATOR

TECHNICAL FIELD

This invention relates to a fully fiber optics based sensor system using a Faraday crystal to detect magnetic permeability anomalies of target elements—such as well string casings, casing collars or casing joints—in well holes from a remote location. The sensing element uses principles of optical diffraction and polarization shift to sense and telemeter permeability changes in the target elements which are subjected to changes in external magnetic fields. The magnitude of the measured permeability within the well hole is a function, among other things, of the mass of the ferromagnetic material present in the target element. A target such as a casing collar presents an additional mass which will appear as permeability anomalies along the length of the casing. Similarly, a corroded section of borehole casing has less mass than a corresponding section of uncorroded casing. The invention permits detection of the permeability anomalies that exist as a result of the differences in mass and, therefore, enables accurate location of downhole collars and casing corroded portions.

BACKGROUND OF THE INVENTION

In the petroleum drilling and production industry, a string of casing pipe is cemented into a wellbore to provide structural integrity for the bore hole and prevent vertical migration of fluids between formation zones. An additional string of pipe with a smaller chamber, commonly known as production tubing, is usually placed within the casing string as a conduit for the production of fluids out of the well. The downhole string of casing pipe, which may be thousands of feet in length, is made of a plurality of pipe sections which are joined end to end by threaded connections. The pipe joints, also called collars, have increased mass as compared to the pipe sections. After the sections of pipe have been cemented into the well, logging tools are run to determine the location of the casing collars. The logging tools used include a pipe joint locator whereby the depth is recorded of each of the pipe joints through which the logging tools are passed. The logging tools generally also include a gamma ray logging device which records the depths and the levels of naturally occurring gamma rays that are emitted from various well formations. The casing collar and gamma ray logs are correlated with previous open hole logs which results in an accurate record of the depths of the pipe joint across the subterranean zones of interest and is typically referred to a tally log.

It is often necessary to accurately determine the location of one or more casing collar joints in a well. This need arises, for example, when it is desired to isolate strata with packers and perforate the well casing between the packers within a producing stratum of the formation, or to identify expansion joints, gas-lift valves, etc.

In order to identify casing collar joints, an appropriate well tool is lowered into well casing on a length of tubing, either coiled or jointed. Given the need for precision as to the depth, pipe joint depth information available from previously recorded joint and tally logs taken during well drilling is not sufficiently accurate. Regardless of the care and precision taken during the drilling process, true depth measurements are affected by tubing elasticity, stretch, thermal expansion, non-linearity of the well bore and the casing itself, and other variable regularities. Similarly, the accurate depth of the tubing string lowered into the well is also subject to error from the same causes. In the case of coiled tubing used to lower well tools, there is a tendency to spiral due to forcing the coil down or along a horizontal section of the well.

A variety of pipe string joint indicators have been developed including slick line indicators that can produce drag inside the pipe string and wire line indicators that send an electronic signal to the surface by the way of electric cable and others. These devices, however, either cannot be utilized as a component in a coiled tubing system or have disadvantages when so used. Wireline indicators do not work well in highly deviated holes because they depend on the force of gravity to position the tool. In addition, the wire line and slick line indicators take up additional rig time when used with jointed tubing.

In recent years, there have been more sophisticated systems and methods devised to improve accuracy of collar locators. These include systems and methods employing magnetic field measurements. While such inventions have advanced the art, there remain problems in the field. For example, certain collar locators operate on the well known principle that an electromotive force (emf) is induced in a coil that is either stationary in a magnetic field that varies in intensity or is moving with respect to a constant magnetic field. Conventional casing collar locators of this type typically rely on the generation of a relatively powerful magnetic field from the locator using either permanent magnet or a coil through which electrical current is passed to induce magnetism. In the latter case, a significant amount of power is required to generate a magnetic field. As the coil passes adjacent to a collar, the flux density of the magnetic field is changed by the additional thickness of the collar. This change is detected by the sensor in the form of a variation in the electromotive force (emf) generated in a coil. The electrical signal is telemetered to the surface and analyzed to determine sensor depth.

Conventional casing collar locators are subject to operational disadvantages and limitations of their effectiveness. They operate, for example, only in a dynamic mode, because the current induced in the coil requires that the sensor move with respect to the casing. If the device is moved too slowly, the changes in emf become subject to signal-to-noise ratio problems, effectively degrading their accuracy. On the other hand, in a rapidly moving sensor, signal strength may be problematic. In any event, the precise location of the sensor is itself lowered by the necessity of pinning down the position of a moving object at any given moment. Other problems are associated with the generation of strong magnetic fields in the wellhole, such as interfering with other instrumentation.

Although methods and apparatus has been known in the past to identify downhole casing collars and problem points of casing corrosion, a need exists for enhanced joint locator and/or pipe corrosions locator information. The foregoing is not intended to identify all of the problems and limitations of previously known systems but should be sufficient to demonstrate that collar and corrosion location systems existing in the past will admit to worthwhile improvement.

SUMMARY OF THE INVENTION

By use of Faraday crystals through which de-polarized light is passed in the presence of an imposed magnetic field, diffraction effects inherent in such crystals permit sensing of magnetic field anomalies which are a function of the mass of nearby casings, tubes and pipes of material with high magnetic permeability. As the casing collars are associated with changes of mass, the system and methods of the present invention are useful as a casing collar locator. Since corrosion and other defects in well casings, tubes and pipes present similar magnetic anomalies, the present invention has further utility in locating zones of corrosion in in-situ well pipe.

THE DRAWINGS

Other aspects of the present invention will become apparent from the following detailed description of embodiments taken in conjunction with the accompanying drawings wherein.

Figure 7A:
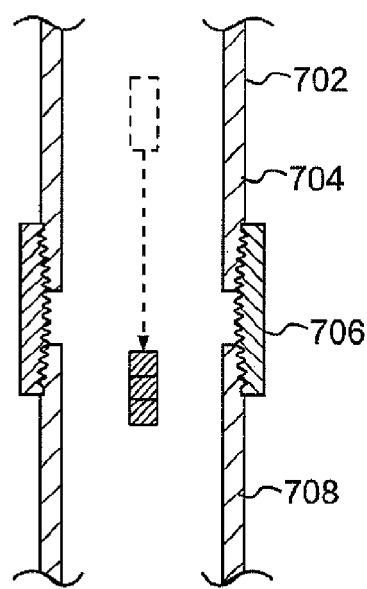
FIG. 7a depicts illustrative positions of a sensor which has been lowered in a well casing in the vicinity of a casing collar.
Figure 7B:
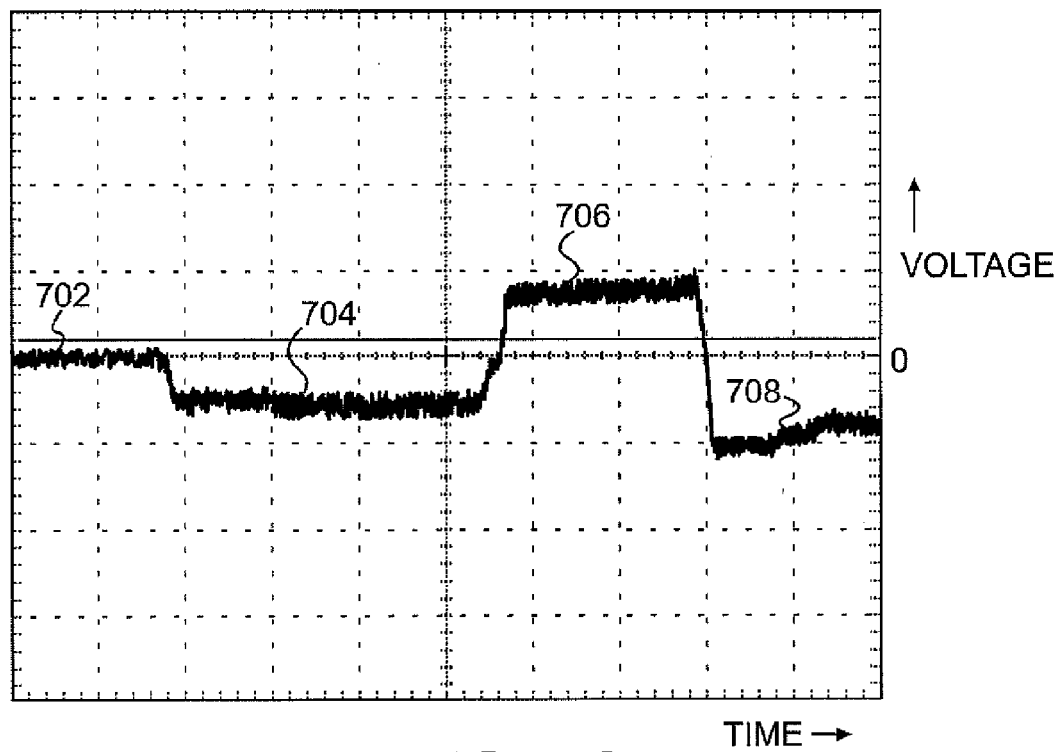
FIG. 7b is a signal output corresponding to such positions, shown as an oscilloscopic trace of voltage (v) as a function of time (t)
Figure 7C:
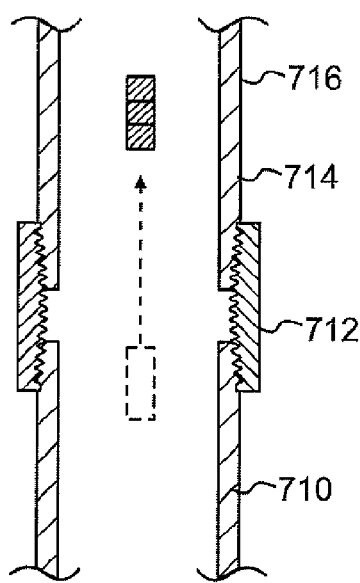
FIG. 7c depicts illustrative positions of the sensor indicated in FIG. 7a as it is retrieved by raising it within the casing and thus passing it again through the region of a casing collar.
Figure 7D:
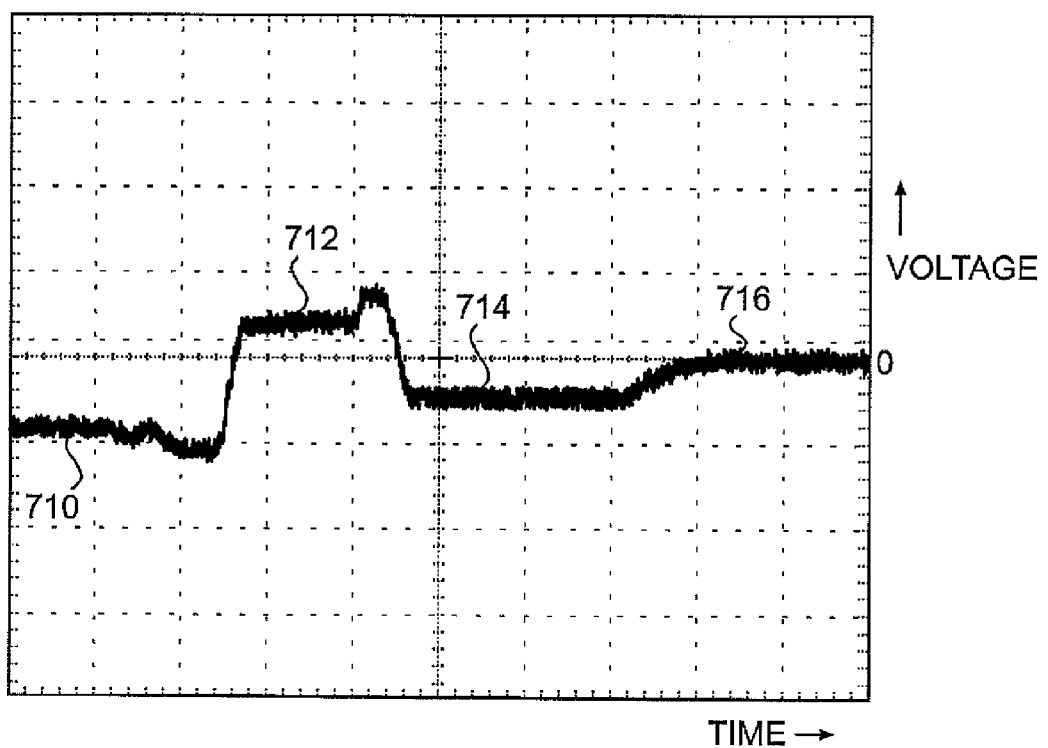
FIG. 7d is a sensor signal output corresponding to the indicated positions, shown as an oscilloscopic trace of voltage (v) as a function of time (t)
Figure 8:
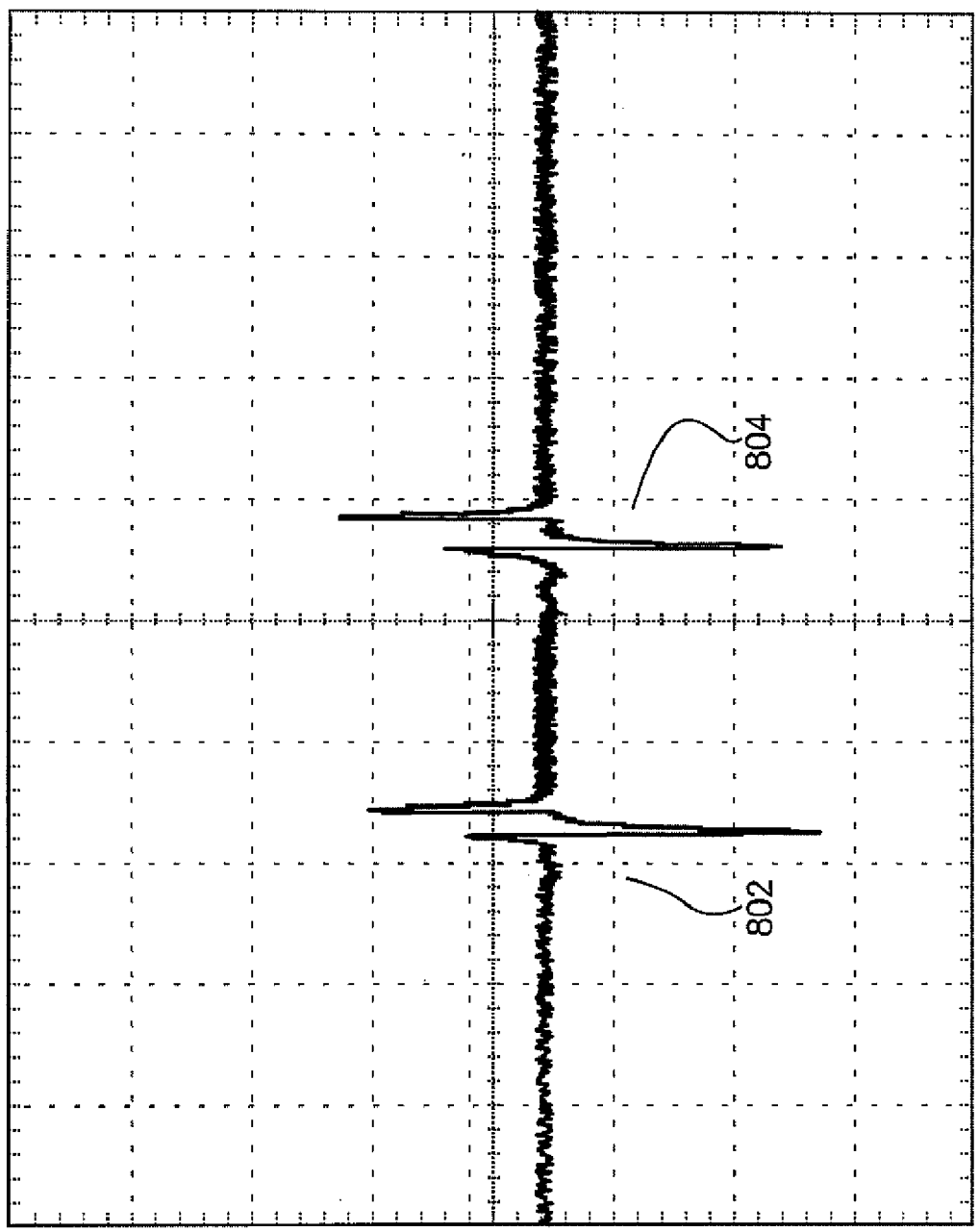
Figure 9:
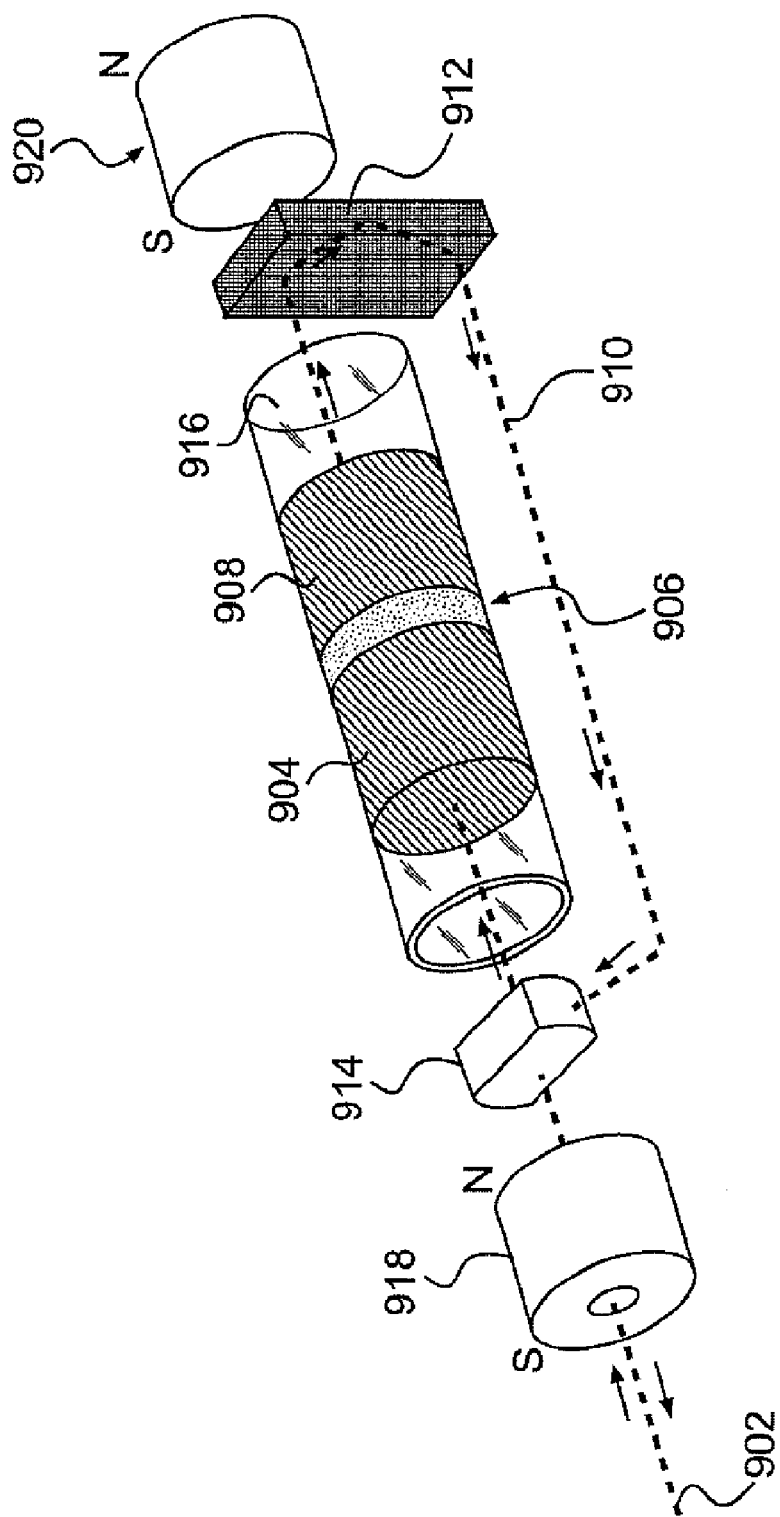

FIG. 8 depicts a differentiation (dv/dt) of the data presented in FIGS. 7c and 7d, as a result of which the permeability anomalies present in the vicinity of a casing collar are reflected as sharply defined optical output variances when the sensor traverses either a downward pass (FIG. 7a) or an upward pass (FIG. 7c) in the wellhole; and FIG. 9 depicts another embodiment of the sensor in which the light beam from a light source is not reflected backwards after passing through the Faraday crystal but is instead guided through an optical fiber loop coupled to the descending optical fiber from the surface.

DETAILED DESCRIPTION

Context of the Invention

Figure 1:
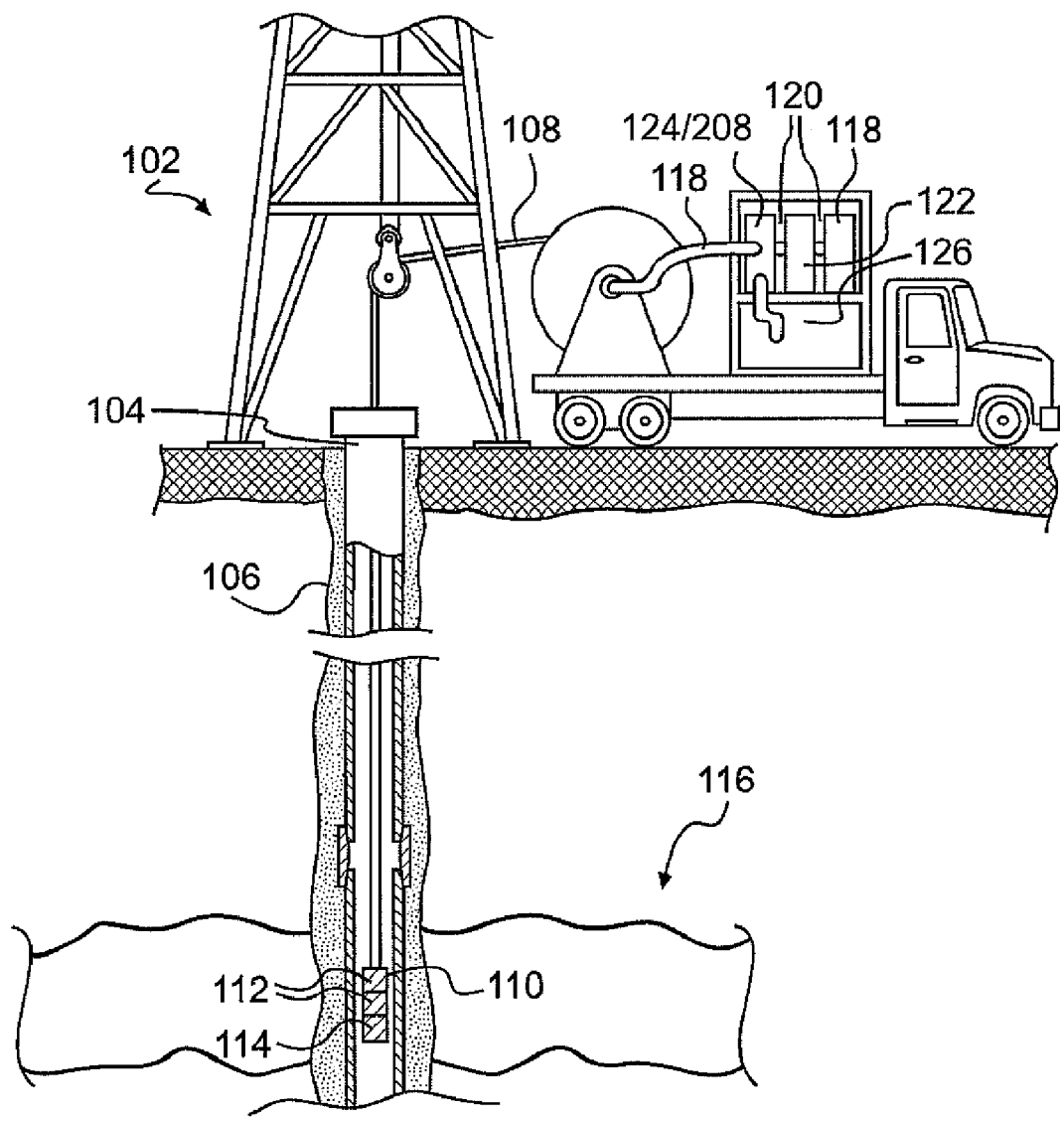
FIG. 1 is a representation of the system of the invention in the context of its application at an oil well site.

Turning now to the drawings wherein like numerals indicate like parts, FIG. 1 is a representation of an oil well drilling system which identifies an operative context of the invention. A conventional drilling derrick 102 is shown positioned above an oil well borehole. A casing 104 has been installed within the borehole and cemented in place as at 106. The borehole may extend thousands of feet into the earth's crust, perhaps 25,000 feet or so, into an oil and/or gas bearing formation. Ambient conditions at this depth may be twenty thousand pounds pressure per square inch and 150-175° C. in temperature.

Oil well logging managers are able to determine and map, on a real time and historical basis, vast amounts of well and formation data using oil well logging tools. In this a wire line cable 108 is connected to a logging tool 110 which has one or more instrumentation sonde sections 112 and a sensing section 114. The logging tool is lowered into the wellhole on the wireline 108 using techniques well known to those in the art. The sensing section or sections 114 are positioned within a formation zone 116 where logging is to occur. An optical fiber (not shown) is run along with the wireline to the casing collar locator sensor (not shown) within the sensor section 114.

A source of coherent light 118 is directed through an optical fiber cable 110 containing a first optical fiber (not shown). An optical de-polarizer 122 is connected in line with said first optical fiber. An optical coupler or optical circulator 124 couples the first optical fiber with a second optical fiber (not shown) within a cable 120 which second optical fiber is connected to a signal detection and analyzer stage 126.

Fiber Optic Sensing System Employing Diffraction Effect of Faraday Rotator.

Figure 2:
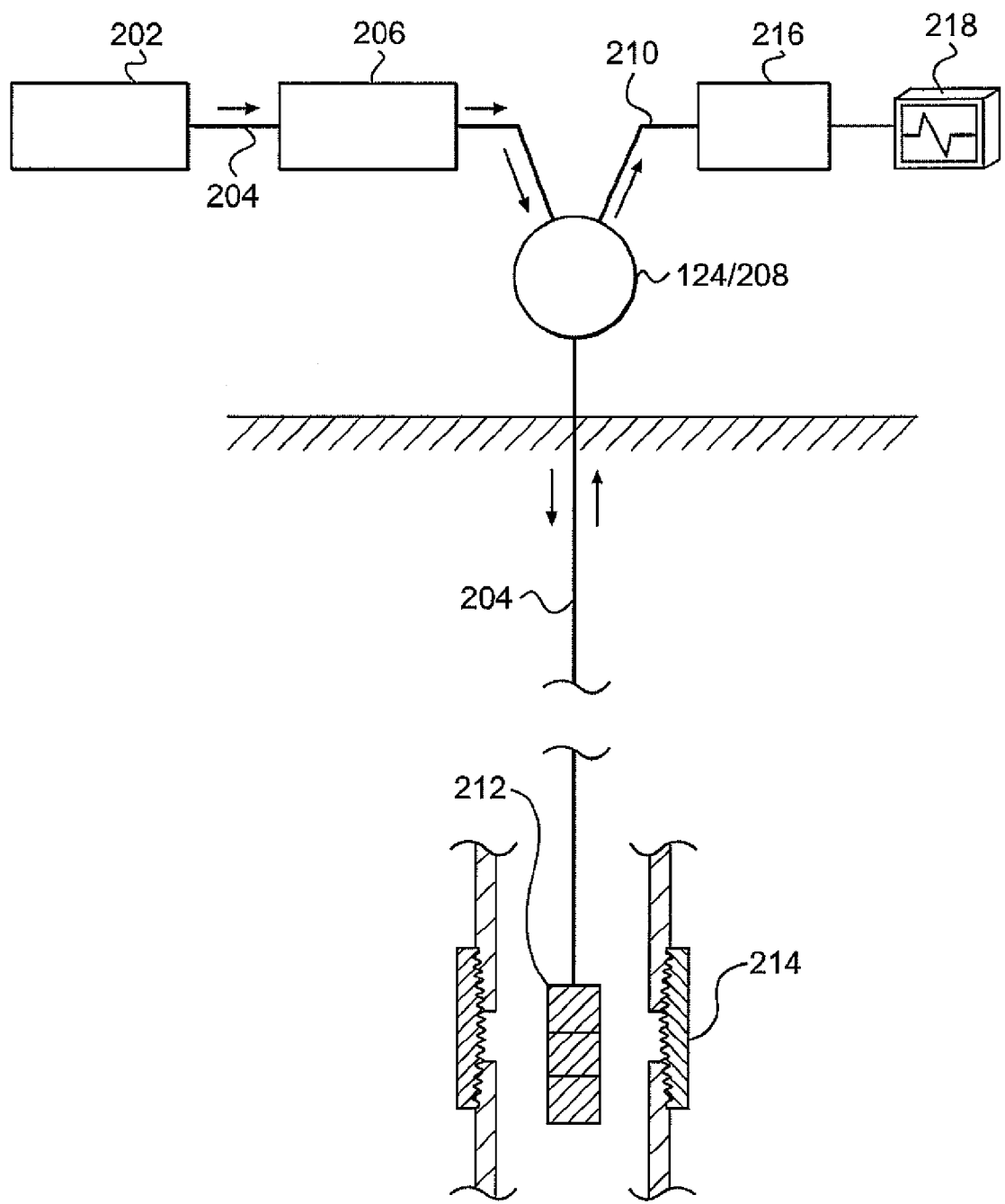
FIG. 2 is a schematic diagram of the components of a preferred embodiment of the invention.

One preferred embodiment of the invention is schematically illustrated in FIG. 2. A coherent source of light 202 is output into a first optical fiber 204. The depolarizer 206 is connected in line with the first optical fiber 204, which in turn is coupled with an optical coupler or optical circulator 208 to a second optical fiber 210. The light is completely depolarized using any one of a number of commercial depolarizing devices well known in the art.

De-polarized light emerging from the depolarizer 206 is guided within the first optical fiber 204 downhole and passed through a magnetooptical sensor (not shown, but described more fully below) within the instrumentation section 212 of the sonde. The sensor is lowered by the wireline (not shown) or other means to a depth in the wellhole within the vicinity of a casing collar 214. The sensor is placed close to the casing inner wall, approximately 25 mm (one inch). For example, the sensor may be mounted on a caliper arm to maintain a fixed distance relative to the casing inner wall regardless of the casing diameter. Therefore, sensitivity of sensor to the casing inner wall will not change. Once within the vicinity of the casing collar, the sensor is further lowered so that it passes below the casing collar. The sensor is then raised to a position above the casing collar.

Light returning from the sensor is guided upward through the optical fiber 204. At the optical coupler or optical circulator 208, the second optical fiber 210 branches the light returning from the sensor and directs it to an optical detector 216 where it is transformed into an electrical signal 218 and subjected to analysis.

Description of Magnetooptical Sensor.

Figure 3:
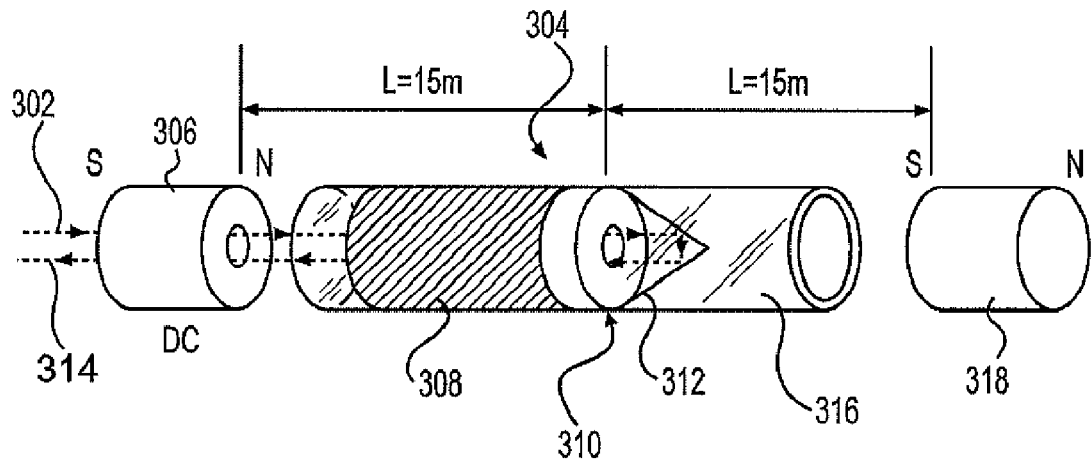
FIG. 3 represents the schematic details of a sensor employed in the invention using a reflected light source.

The invention employs a magnetooptical sensor to detect magnetic permeable anomalies caused by the presence of varying masses of ferromagnetic material present in casings, tubing, and pipe in the downhole environment. Such anomalies are sensed by a sensor comprising at least one optical collimator, a Faraday crystal, and magnets which may be used to create a magnetic field in the vicinity of the sensor. One preferred embodiment of such a sensor is shown in FIG. 3.

De-polarized light 302 is guided into a sensor 304 through a first optical fiber (not shown) and passes through a co-axially mounted magnet 306. The fiber is connected to a collimator 308, which assures that light entering a Faraday crystal 310 positioned after the collimator consists of parallel rays. An optical reflective medium 312 is positioned adjacent to and downstream of the Faraday crystal 310 and reflects incident light 180 degrees back through the first optical fiber 302, as a beam 314 where it is guided back to the surface and through the path described in FIG. 2. For example, the optical reflective medium 312 may be a corner cube or a mirror. A second magnet 314 is placed adjacent to and downstream of the corner cube such that lines of magnetic flux exist between the magnets 306 and 318.

Other devices to accomplish the same light guides, such as using reflecting devices other than a corner cube 312, will readily present themselves to one of skill in the art. One Faraday crystal employed in the embodiment described is an iron garnet. Other magnetooptical crystals are well known in the art.

The sensor is preferably housed within a cylindrical capillary 316 to maintain alignment of its components and to protect it from the often harsh ambient temperature and pressure conditions within a bore hole. In one preferred embodiment, the capillary 316 has an outside diameter of 2.7 mm. and a length of about 30 mm total, with the Faraday crystal centered within the length of the capillary. Magnets are positioned in a manner which allows adjustment, as a means of affecting sensitivity of the sensor and of biasing the baseline signal. The sensor unit may be packaged into a pressure-sealed non-magnetic metal housing (not shown) in order to withstand downhole pressure conditions.

Figure 4:
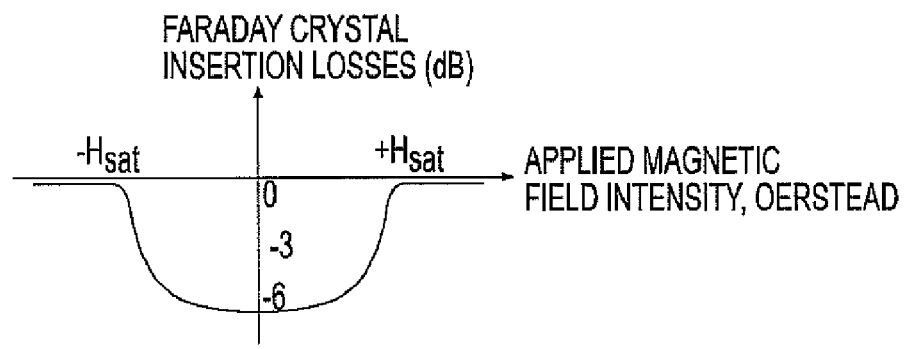
FIG. 4 depicts a typical plot of Faraday crystal losses (in dB) as a function of an applied magnetic field intensity (in Oersteads) wherein a bias point may be located within the regions of linearity on the curve, thus permitting more convenient determinations of magnetic field anomalies.

FIG. 4 is a plot of the attenuation of the light, i.e., insertion loss, (in dB) traversing a Faraday crystal as a function of the applied magnetic field (in Oersteads). Adjustments of the magnetic field strength surrounding the sensor can be made by adjusting the positions of the magnets within the sensor. Such adjustments permit biasing the sensor output so as to establish convenient base line responses from the sensor in regions when the casing, but not casing collars, influence the intensity of the light beam passed through the sensor. Sharper delineation of the effect of the greater mass of a casing collar (or the lesser mass of a zone of corrosion) is thus produced when the sensor is positioned near collars or zones of corrosion.

Figure 5:
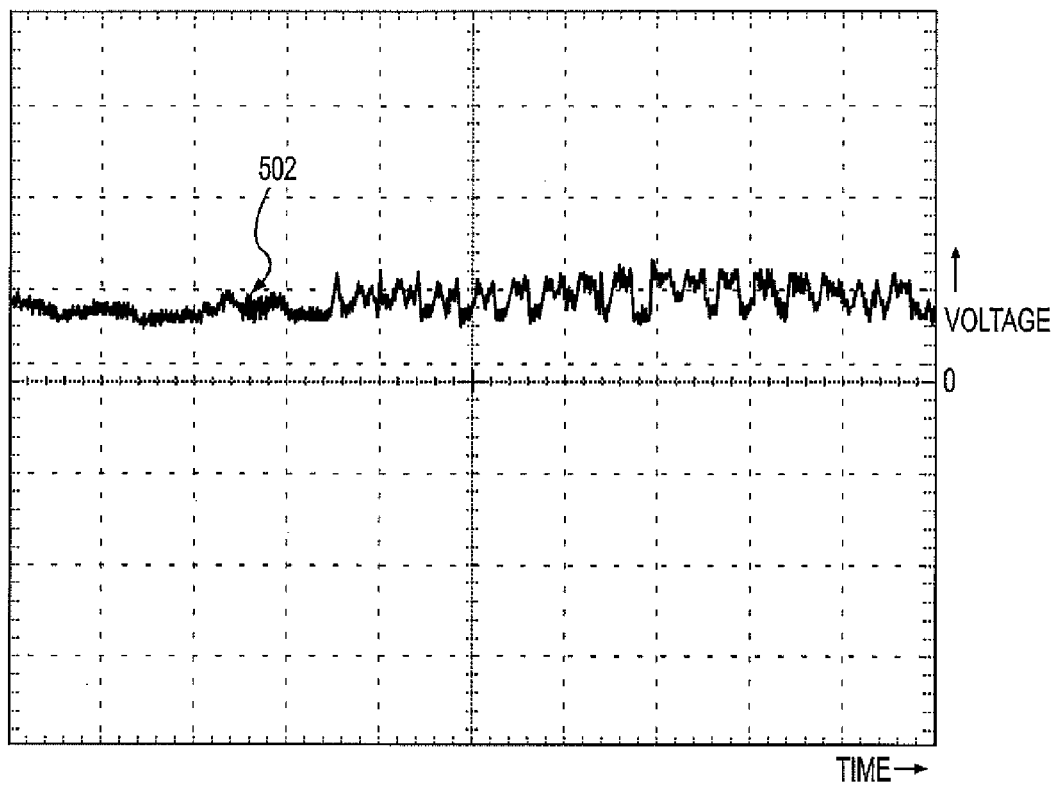
FIG. 5 is a representative signal output from a sensor which uses polarized light.
Figure 6:
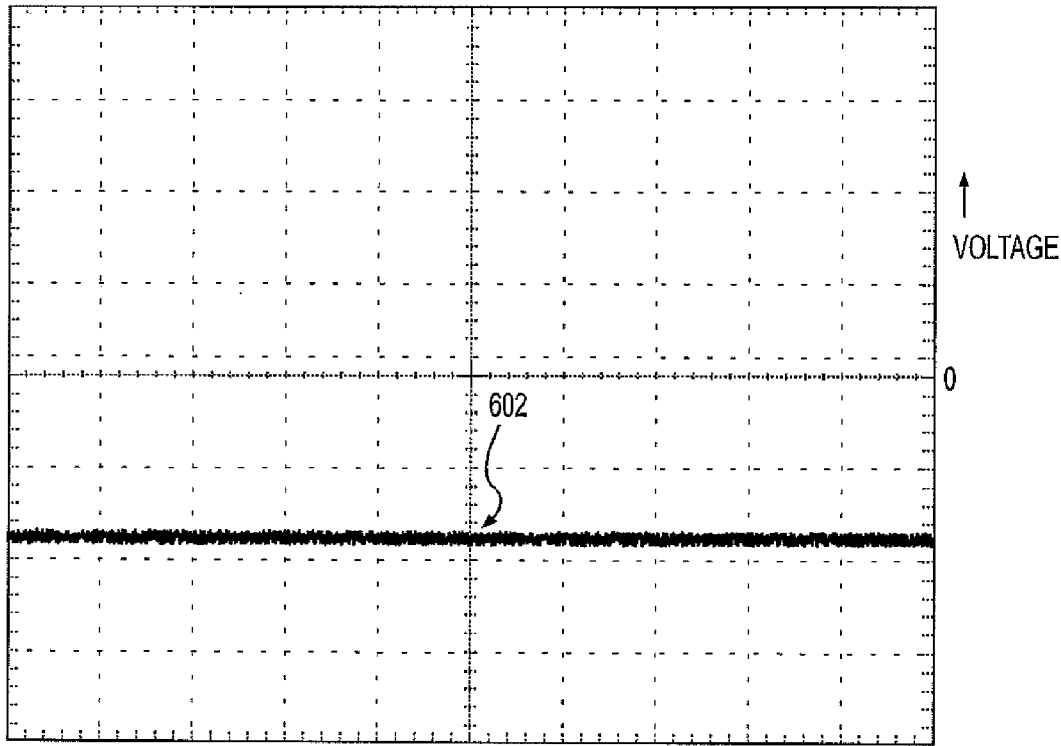
FIG. 6 is a representative signal output from a sensor which uses light that has been depolarized.

The use of non-polarized light is preferred in the operation of the sensor 304. FIG. 5 shows an oscilloscope trace of a baseline 502 of a returned signal in which polarized light was employed. FIG. 6, by contrast, shows a baseline 602 of the returned signal in which de-polarized light was used. De-polarized light provides a cleaner, more stable baseline from which magnetic anomalies may be more accurately determined.

FIGS. 7a and 7c illustrate the positions of a sensor as it is first lowered (FIG. 7a) and then retrieved (FIG. 7c) within a borehole casing. The positions 702 through 708 correspond to positions in a region 702 where there is little influence from the lower flux density of the magnetic field in the vicinity of the casing collar; at position 704 where the sensor is in a region of higher flux density due to its location closer to the casing collar; then at position 706 in a region of highest flux density; and finally at position 708 where the sensor has been lowered to a position where the collar has little influence on flux density. The intensity of light passing through the sensor is affected by the magnitude of the field, which is, in turn, a function of the mass of ferromagnetic material in the vicinity. Similarly, the positions 710 through 716 in FIG. 7c correspond to equivalent positions as the sensor is retrieved by raising it in the casing from a position 710 below the casing collar 712 to a position 716 above the casing collar.

The data illustrated in FIGS. 7b and 7d are oscilloscope traces which plot an electrical analogue of the intensity of light passing through the Faraday crystal in the various positions of the sensor indicated in FIGS. 7a and 7c, respectively.

The reader of ordinary skill in the art will note that the deflections or magnitude of the voltage reflected in the traces of data shown in FIGS. 7b and 7d are not necessarily directly linearly relatable to the mass of the ferromagnetic material in the pipe. The actual magnetic flux strengths may be affected by ambient magnetic effects which can increase or decrease the actual flux density at a given point. Notwithstanding, the effectiveness of the invention lies in the relative impact upon light intensity of the magnetic field imparted by the magnets associated with the sensor.

Furthermore, it is not to be suggested the utility of the invention requires that the sensor be lowered or raised at constant speeds. Indeed, the sensor may be moved in increments or at varying speeds, the only limitation being that the sensor not be moved so swiftly as to present signal to noise deterioration of data. Indeed, the ultimate aim in the use of the sensor is to provide, in effect, a plot of data which correlates to light intensity as a function of distance along the observed section of well casing, pipe or tube, as the case may be.

In the preceding several paragraphs, the embodiment described relates to the use of the invention to detect the location of casing collars, but the invention is not so limited. It is a fundamental feature of the disclosed invention that changes in magnetic flux affect the diffraction of light passing through a Faraday crystal of magnetooptical properties, as discussed by G. B. Scott and D. E. Lacklison, "Magnetooptic Properties and Applications of Bismuth Substituted Iron Garnets," *IEEE Transactions on Magnetics*, Vol. Mag. 12, No. 4, July 1976, and T. R. Johansen et al, "Variation of Stripe Domain Spacing in a Faraday Effect Light Deflector," *Journal of Applied Physics*, Vol. 42, No. 4, Mar. 15, 1971. The disclosures of these publications are hereby incorporated herein by reference. Changes in flux are presented where anomalies occur in the magnetic permeability of well casings, pipes and tubes. Such anomalies are present near casing collars which typically involve greater concentrations of mass over that of the casing tubing they join. They are also presented by the presence of corrosion or other defects in the walls of in-situ casings, pipes and tubes. Therefore, the invention may be used to detect corrosion and such other defects.

Returning to the analysis of data obtained by use of the sensor described above, the data presented in FIGS. 7c and 8d may be used directly to determine the position of the casing collar. It may also be useful to mathematically differentiate the data so as to present a starker, more sharply defined location of the anomalies. FIG. 8 reflects such a treatment of the data reflected in FIGS. 7a and 7c. The figure is a plot of dv/dt of the data in FIGS. 7a and 7b. The first (left) spike 802 in FIG. 8 delineates a magnetic anomaly detected as the sensor is moved down the casing through the region where the magnetic flux is affected by the presence of the casing collar; the second (right) spike 804 delineates the same anomaly as the sensor is retrieved upwardly past the same collar. The wellhole depth, and hence the location of the casing collar, is then determined by cross calibrating the position of the sensor with other well logging data, such as a gamma log.

In the sensor described above, light traverses the Faraday crystal twice, due to its reflection by the corner cube 312 in FIG. 3. This double passage of the light results in larger insertion losses. The loss may be lessened, and sensitivity of the results improved, by the use of a single pass of the light. Such a sensor is depicted in FIG. 9.

A fiber optic light beam 902 is passed through a collimator 904, a Faraday crystal 906, and a second collimator 908. Instead of being reflected backward, an optical fiber loop 910 is created by means of a mini-bend fiber 912 capable of a bending radius of less than 15 mm. The loop is re-coupled to the first optical fiber 902 through an optical coupler 914. The sensor is housed in a capillary 916, which may be composed of glass or other material capable of withstanding ambient temperature and pressure conditions within the well hole, and is provided with magnets 918 and 920 necessary for the operation of the Faraday crystal. As the sensor depicted in FIG. 9 does not involve dual passage of the sensing beam through the Faraday crystal, the beam experiences reduced insertion losses, and, therefore, the sensor is more sensitive.

The foregoing embodiments have each employed a single optical fiber through which light is transmitted downhole to a sensor and simultaneously returned to a photo-detector located at the surface. Other embodiments may be employed in which separate optical fibers are used for insertion of light to a sensor and as a return guide of the light after its passage through a Faraday crystal. Such an embodiment would not require optical couplers which also entail insertion losses and, thus, the embodiment may present more sensitive data results.

To the extent that operations described in the embodiments above may be performed by different components, it should be apparent to those of ordinary skill in the art, that different components may be used. For example, a light beam shaping device is not intended to be limited to a collimator, but such shaping may also be performed by a focuser, a lens, or a particular extremity of an optical fiber. Similarly, a light reflection element is not limited to a corner cube but may be performed by other devices known in the art.

In this application and claims, the terms casing, pipe and tubing are used in their broadest sense to include all forms of well casing, pipes and tubes and of all compositions, limited only by requirement that they exhibit magnetic permeability sufficient to affect the light intensity of unpolarized coherent light passing through magnetooptical crystals exhibiting a Faraday diffraction effect.

The various aspects of the invention were chosen and described in order to best explain principles of the invention and its practical applications. The preceding description is intended to enable those of skill in the art to best utilize the invention in various embodiments and aspects and with modifications as are suited to the particular use contemplated. It is intended that the scope of the invention be defined by the following claims.

What is claimed is:

1. A system for locating magnetic permeability anomalies in wellhole piping and tubing installed within a borehole, said system comprising:
    a source of light located outside a well;
    a first optical fiber operable to extend into a wellhole connected to said source of light;
    an optical depolarizer in line with the said first optical fiber and located between the well hole and the source of light;
    an optical coupler or optical circulator in line with the said first optical fiber located between the optical polarizer and the well hole;
    a second optical fiber connected to the said optical coupler or optical circulator;
    a signal detector and analyzer connected to said second optical fiber; and
    a sensor assembly connected downhole to said first optical fiber, including:
        magnets oriented to create a magnetic field within the vicinity of said sensor,
        an optical collimator attached to said first optical fiber,
        a Faraday crystal positioned downstream of said optical collimator,
        an optical reflecting device positioned downstream of said Faraday crystal capable for redirecting the light back through said first optical fiber and, ultimately, to the said signal detector and analyzer located at the well surface, wherein said sensor assembly is operable to experience light insertion losses as a function of perturbations in magnetic fields near said sensor resulting from the masses of downhole tubing adjacent to the sensor assembly.

2. A system for locating magnetic permeability anomalies in wellhole tubing installed within a borehole, as defined in claim 1, in which said optical reflecting device consists of a corner cube or a mirror.

3. A system for locating magnetic permeability anomalies in wellhole tubing installed within a borehole, as defined in claim 1, in which the said sensor assembly connected downhole to said first optical fiber, comprises:
    magnets oriented to create a magnetic field within the vicinity of said sensor;
    a Faraday crystal;
    a first and a second optical collimator attached, respectively, to opposite sides of said Faraday crystal; and
    an optical coupler or optical circulator which couples said first optical fiber to (a) a third optical fiber, one end of which is connected to said optical coupler and the other end of which is connected to the upstream side of said first collimator, and to (b) a fourth optical fiber, one end of which is connected to the downstream side of said second optical collimator and the other end of which is connected to said optical coupler or optical circulator, wherein incident light from the first optical fiber is guided through the optical coupler or optical circulator, the first collimator, the Faraday crystal, the second optical collimator, and is redirected back through the first optical fiber and, ultimately, to the said signal detector and analyzer located at the well surface.

4. A system for locating magnetic permeability anomalies in wellhole tubing installed within a borehole, as defined in claim 2, and further comprising a mini-bend fiber connected between the downstream side of said second collimator and said optical coupler.

5. A system for locating magnetic permeability anomalies in wellhole tubing installed within a borehole, as defined in claim 1, and further comprising a glass capillary surrounding at least said optical collimator and said Faraday crystal.

6. A system for locating magnetic permeability anomalies in wellhole tubing installed within a borehole, as defined in claim 1, and further comprising a first and second permanent magnets positioned at each end of the sensor assembly.

7. A method for locating magnetic permeability anomalies in wellhole tubing installed within a borehole, said method comprising the steps of:
    providing a source of light located outside a well;
    depolarizing light from said source of light;
    transmitting said depolarized light through an optical fiber into a wellhole to a sensor;
    creating a magnetic field in the vicinity of said sensor;
    collimating the depolarized light passing through said sensor;
    positioning said sensor within said wellhole tubing;
    moving said sensor in proximity to the wellhole casing such that the mass of the wellhole casing affects the magnetic lines of flux within the Faraday crystal and, in turn, affects the insertion loses of the collimated and depolarized light traversing the Faraday crystal;
    reflecting light which has traversed the Faraday crystal back to the optical fiber for transport to the surface of the well; and
    detecting and analyzing said reflected light for insertion losses to determine magnetic permeability anomalies within the wellhole tubing.

8. A method for locating magnetic permeability anomalies in wellhole tubing installed within a borehole, as defined in claim 7, wherein said step of creating a magnetic field comprises:

creating magnetic lines of flux in the vicinity of the said sensor with permanent magnets positioned upstream and downstream of said sensor.

9. A method for locating magnetic permeability anomalies in wellhole tubing installed within a borehole, as defined in claim 8, wherein said step of creating a magnetic field comprises:

creating magnetic lines of flux in the vicinity of the said sensor with permanent magnets positioned upstream and downstream of said sensor the positions of which magnets are adjustable.

10. A method for locating magnetic permeability anomalies in wellhole tubing installed within a borehole, as defined in claim 9, wherein said step of reflecting light which has traversed the Faraday crystal back to the optical fiber for transport to the surface of the well comprises:

guiding the light traversing the Faraday crystal through a second collimator and through an optical fiber loop such that light traverses the Faraday crystal only once before it is transported to the surface of the well.

11. A method for locating magnetic permeability anomalies in wellhole tubing installed within a borehole, as defined in claim 7, wherein said step of detecting and analyzing said reflected light for insertion losses, comprises:

diffracting the light by means of a Faraday crystal in the presence of a magnetic field the strength of which varies along the path of the sensor as a result of the variation of the mass of the wellhole tubing on such path.

* * * * *